United States Patent [19]

Miyatake

[11] Patent Number: 4,697,200
[45] Date of Patent: Sep. 29, 1987

[54] FIELD STORAGE DRIVE IN INTERLINE TRANSFER CCD IMAGE SENSOR

[75] Inventor: Shigehiro Miyatake, Osaka, Japan

[73] Assignee: Sharp Kabushiki Kaisha, Osaka, Japan

[21] Appl. No.: 688,661

[22] Filed: Jan. 3, 1985

[30] Foreign Application Priority Data

Jan. 10, 1984 [JP] Japan .................................. 59-3792

[51] Int. Cl.$^4$ ...................... H01L 29/78; H01L 27/14
[52] U.S. Cl. .......................................... 357/24; 357/30
[58] Field of Search .................. 357/24 LA, 24 M, 30

[56] References Cited

U.S. PATENT DOCUMENTS 3,845,295 10/1974 Williams et al. ............... 357/24 LR
3,856,989 12/1974 Weimer ................................. 357/24

FOREIGN PATENT DOCUMENTS 2103875 2/1983 United Kingdom ........... 357/24 LR

Primary Examiner—Martin H. Edlow
Assistant Examiner—Robert P. Limanek
Attorney, Agent, or Firm—Birch, Stewart, Kolasch & Birch

[57] ABSTRACT

A CCD image sensor includes a plurality of PN junction photodiodes aligned in a matrix fashion, and a plurality of CCD vertical shift registers of which each register element is associated with one of said plurality of PN junction photodiodes. A transfer gate is formed between the corresponding pair of CCD shift register element and the PN junction photodiode. The CCD image sensor does not have channel stoppers between the PN junction photodiodes. Register electrodes are made of upper register electrodes and lower register electrodes which are extended to portions provided between the adjacent two PN junction photodiodes. The upper register electrodes overlap the lower register electrodes at desired portions to achieve the shift operation in the CCD vertical shift registers. By properly controlling the clock pulses applied to the upper and lower register electrodes, electrical isolation is achieved between adjacent two PN junction photodiodes. At a timing when the charges stored in the PN junction photodiodes are transferred to the CCD vertical shift register, the clock pulse applied to the lower register electrodes bears three levels $V_L$, $V_I$ and $V_H$.

5 Claims, 8 Drawing Figures

FIELD STORAGE DRIVE IN INTERLINE TRANSFER CCD IMAGE SENSOR

BACKGROUND OF THE INVENTION

1. Field of the Invention

The present invention relates to a CCD (Charge Coupled Device) image sensor including PN junction photosensor elements and, more particularly, to a novel drive system for ensuring electrical isolation between the PN junction photosensor elements.

2. Description of the Prior Art

Recently, solid state image sensors have been developed for use in color video cameras. Solid state image sensors can be classified into an XY address image sensor type and a CCD image sensor type. The CCD image sensor has an advantage in an improved S/N ratio (signal to noise ratio) because the output capacity of the CCD image sensor is substantially small. In particular, an interline transfer CCD image sensor including PN junction photodiodes shows a high sensitivity to blue light, and exhibits a high resolution in combination with a mosaic color filter.

Normally, the CCD has a simple structure. However, various requirements in the function and the characteristics thereof made the structure of such a CCD somewhat complicated. The complicated structure requires increased number of masks and, therefore, the characteristics of the CCD image sensor have become variable.

In order to simplify the structure of the CCD image sensor including photodiodes, the present inventor has developed a novel structure, wherein channel stoppers are not required to electrically isolate photodiodes. An example of this structure is disclosed in copending application Ser. No. 515,038, "STRUCTURE AND DRIVING METHOD OF INTERLINE TRANSFER CCD IMAGE SENSOR", filed on July 18, 1983, by Shigehiro MIYATAKE, and assigned to the same assignee as the present application. The European counterpart is European Patent Application No. 83304183.3, which was published on Feb. 8, 1984 as No. 0 100 199 A2. Since the channel stoppers are not required between the photodiodes, the mask alignment operation is simplified. Thus, the characteristics of the CCD image sensor become constant.

However, the drive method disclosed in the above-mentioned application is of the frame storage type. Therefore, there is a possibility that a residual image is formed when objects move fast.

OBJECTS AND SUMMARY OF THE INVENTION

Objects of the Invention

Accordingly, an object of the present invention is to provide a novel drive method for a CCD image sensor including PN junction photodiodes.

Another object of the present invention is to provide a field storage type drive method for a CCD image sensor which includes PN junction photodiodes, but does not include channel stoppers between the photodiodes.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Summary of the Invention

The CCD image sensor related to the present invention has the same construction as that disclosed in my copending application Ser. No. 515,038. That is, a plurality of PN junction photodiodes are aligned in a matrix fashion. A plurality of columns of CCD shift registers are associated with the matrix aligned PN junction photodiodes. Each CCD shift register includes a plurality of register elements, each of which includes a buried channel connected to a corresponding PN junction photodiode via a transfer gate as a potential barrier. Two layered register electrodes formed on the buried channel are extended to cover the transfer gate so as to control the charge transfer from the PN junction photodiode to the CCD shift register.

In accordance with the present invention, at a timing during which the charges are transferred from the PN junction photodiode to the CCD shift register, a three-level clock pulse is applied to a lower electrode of the two layered register electrodes of the CCD shift register. The three-level clock pulse ensures a field storage type drive without decreasing the maximum signal charges in the CCD image sensor wherein the channel stoppers are omitted between the PN junction photodiodes.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figures 1, 2:
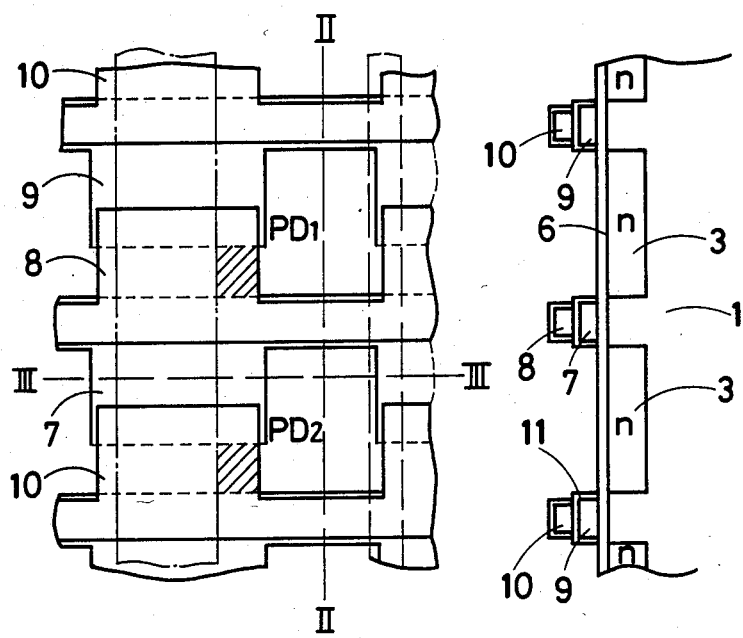
FIG. 1 is a plan view of a CCD image sensor related to the present invention.
FIG. 2 is a sectional view taken along line II—II of FIG. 1.
Figure 3:
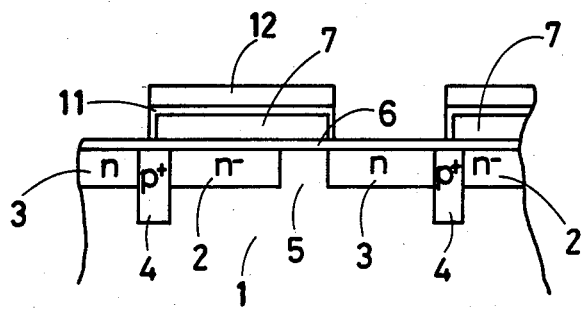
FIG. 3 is a sectional view taken along line III—III of FIG. 1.

FIGS. 1, 2 and 3 show a CCD image sensor related to the present invention. The CCD image sensor of FIGS. 1, 2 and 3 have the same structure as that disclosed in my copending application Ser. No. 515,038.

Photodiodes 3 are formed in a substrate 1 and are arranged in a matrix fashion. Buried channel CCDs including n layers 2 are formed adjacent the photodiodes 3. Transfer gates 5 are formed between each pair of a corresponding photodiode 3 and n layer 2. Channel stoppers 4 are formed between the n layer 2 and the adjacent photodiode 3 to achieve the electrical isolation. An insulation film 6 is formed on the substrate 1. Lower polysilicon electrodes 7 and 9 are formed on the insulation film 6 except at the portions thereof where the photodiodes 3 or the transfer gates 5 are formed. The portions of the transfer gates 5 are covered by upper polysilicon electrodes 8 and 10. The upper polysilicon electrodes 8 and 10 include portions which overlap the lower polysilicon electrodes 7 and 9 with the intervention of insulator films 11. By properly applying clock pulses to the lower and upper polysilicon electrodes 7, 9, 8 and 10, the charges generated in the photodiodes 3 are transferred to the CCD shift registers, and are transferred within the CCD shift registers. An aluminum light shield 12 is formed on the N layer 2 for the shift register and the transfer gate 5.

The main feature of the CCD image sensor of FIGS. 1, 2 and 3 is that the channel stoppers are not required between the n layers 3 which form the photodiodes as shown in FIG. 2. The channel stoppers 4 are required only to isolate the n layers 3 of the photodiodes from the n layers 2 of the adjacent CCD vertical shift register. As discussed in my copending application Ser. No. 515,038, the mask construction is therefore simplified. The n layers 3 of the photodiodes are self-aligned with respect to the gate electrodes using the upper and lower polysilicon layers 7, 8, 9 and 10 as a mask.

Figure 4:
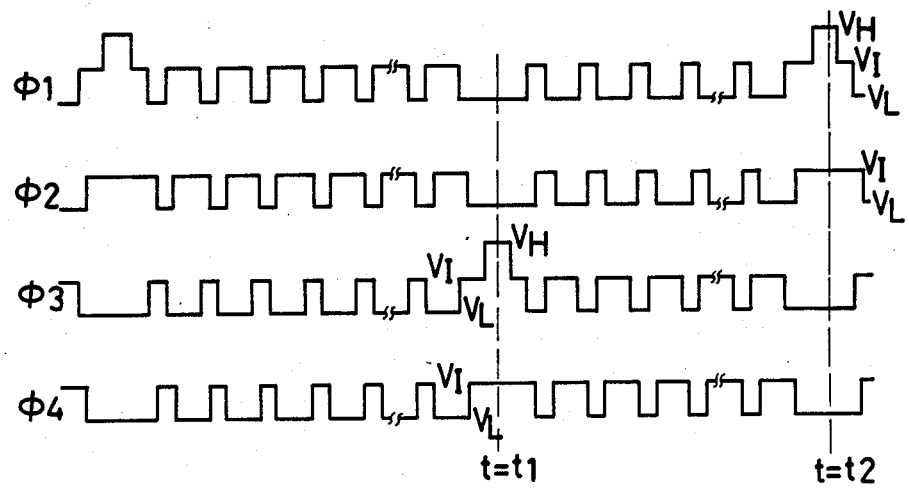
FIG. 4 is a waveform chart showing clock pulses which are applied to register electrodes in a conventional drive system.

FIG. 4 shows clock pulses $\phi_1$, $\phi_2$, $\phi_3$ and $\phi_4$ which are applied to the polysilicon electrodes 10, 7, 8 and 9, respectively, in the drive system disclosed in my copending application Ser. No. 515,038. The clock pulses $\phi_2$ and $\phi_4$ applied to the lower polysilicon electrodes 7 and 9 take two levels $V_L$ and $V_I$. The clock pulses $\phi_1$ and $\phi_3$ applied to the upper polysilicon electrodes 10 and 8 take three levels $V_L$, $V_I$ and $V_H$. At a time when the clock pulse $\phi_1$ or $\phi_3$ bears the level $V_H$, the signal charges stored in the photodiode are transferred to the CCD vertical shift register via the transfer gate 5 (hatched portion in FIG. 1) formed under the electrode 10 or 8. Although the channel stoppers are not formed between the photodiodes, the signal charges are not mixed because the clock diodes $\phi_2$ and $\phi_4$ applied to the lower polysilicon electrodes 7 and 9 bear the levels $V_L$ and $V_1$, respectively. While the clock pulses $\phi_1$ and $\phi_3$ change between the levels $V_L$ and $V_I$, the signal charges are transferred upward in the CCD vertical shift register in FIG. 1.

As already discussed above, the signal charges stored in the photodiode $PD_1$ are transferred to the CCD vertical shift register at a time $t=t_1$ at which the clock pulse $\phi_3$ bears the level $V_H$. The signal charges stored in the photodiode $PD_2$ are transferred to the CCD vertical shift register at a time $t=t_2$ where the clock pulse $\phi_1$ bears the level $V_H$. In this way, the read out operation is correlated with the interlace of the television standard. The above-mentioned read out operation is referred to as the frame storage type wherein the pair of photodiodes are alternatively read out in each field. Each photodiode accumulates the signal charges for one frame period (1/30 seconds) and, therefore, a residual image is formed when the object moves fast.

There is another type of read out operation which is refererred to as the field storage type, wherein each photodiode accumulates the signal charges for one field period (1/60 seconds), and the signal charges stored in two photodiodes are mixed with each other. The pair of the photodiodes is changed between the odd field and the even field so as to correlate with the interlace. The vertical resolution is slightly reduced, but the occurrence of the residual image is minimized.

Figure 5:
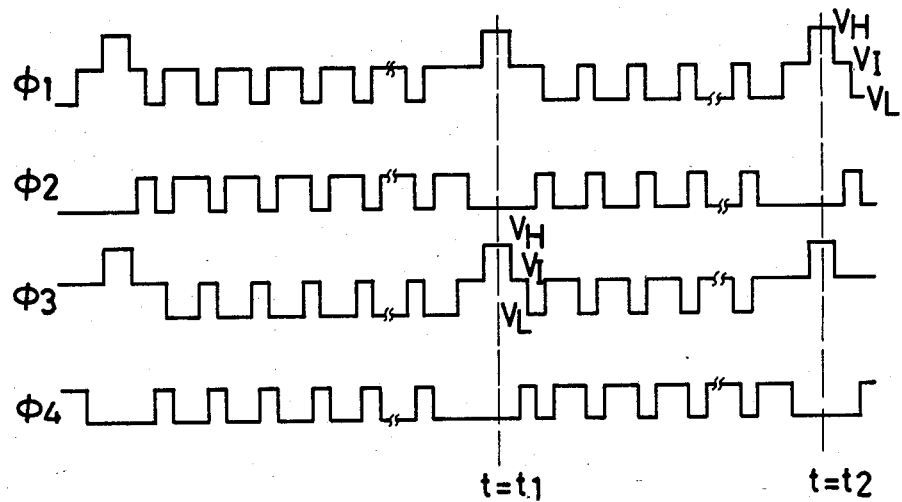
FIG. 5 is a waveform chart showing modified clock pulses considered by the present inventor.
Figure 6:
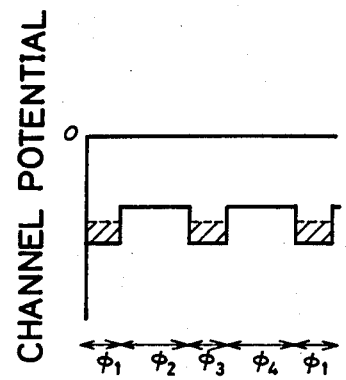
FIG. 6 is a schematic chart showing a charge storage condition when the modified clock pulses of FIG. 5 are applied to the CCD image sensor of FIG. 1.

FIG. 5 shows one approach to conduct the field storage drive in the CCD image sensor of FIGS. 1, 2 and 3. At the timing $t=t_1$ and $t=t_2$, both the clock pulses $\phi_1$ and $\phi_3$ take the level $V_H$ to transfer the signal charges stored in the photodiodes to the CCD vertical shift register. However, the drive method of FIG. 5 has the following problems. The clock pulses $\phi_1$ and $\phi_3$ are applied to the electrodes 10 and 8, respectively, which overlap the lower polysilicon electrodes 7 and 9. Thus, the effective portions are only clearances where the lower polysilicon electrodes 7 and 9 are not formed. Therefore, the signal charges are transferred to a narrow portion in the CCD vertical shift register as shown in FIG. 6. The transferred charges may overflow, and the maximum signal charges are limited by this region.

Figure 7:
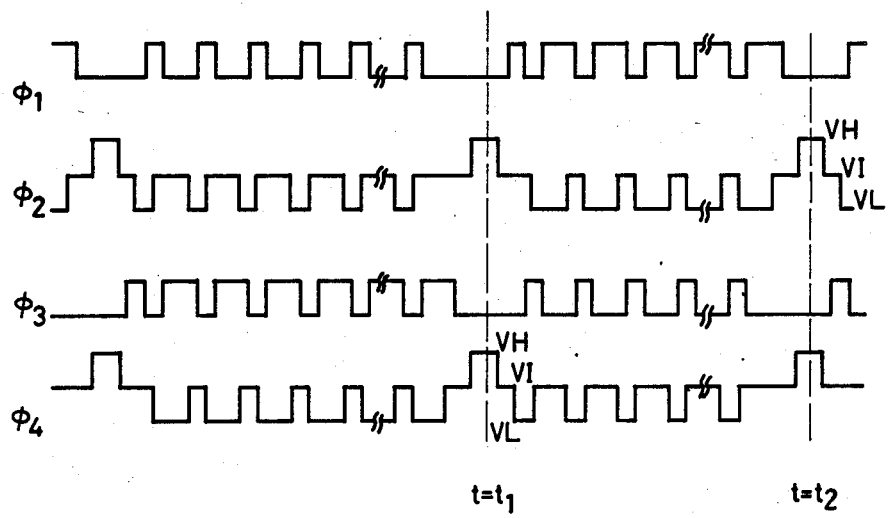
FIG. 7 is a waveform chart showing clock pulses which are applied to register electrodes in accordance with an embodiment of a drive method of the present invention.

FIG. 7 shows clock pulses $\phi_1$, $\phi_2$, $\phi_3$ and $\phi_4$ which are applied to the electrodes 10, 7, 8 and 9 in an embodiment of a drive method of the present invention. At a timing where the signal charges generated in the photodiodes 3 are transferred to the CCD vertical shift registers, the clock pulses $\phi_2$ and $\phi_4$ applied to the lower polysilicon electrodes 7 and 9 change among three levels $V_L$, $V_I$ and $V_H$, and the clock pulses $\phi_1$ and $\phi_3$ applied to the upper polysilicon electrodes 10 and 8 change between two levels $V_L$ and $V_I$. That is, the clock pulse level inversely corresponds to that of the drive method described with reference to FIG. 5.

More specifically, at a time $t=t_1$, both the clock pulses $\phi_2$ and $\phi_4$, which are applied to the lower polisilicon electrodes 7 and 9, respectively, take the level $V_H$ to transfer the signal charges stored in the photodiodes 3 to the CCD vertical shift registers. The clock pulses $\phi_2$ and $\phi_4$ are applied to the lower polisilicon electrodes 7 and 9 which have the function to isolate the photodiodes 3. However, the signal charges stored in the photodiodes 3 are not mixed with each other because the potential applied to the portion provided between the photodiodes 3 is lower than the potential applied to the portion provided between the photodiode 3 and the CCD vertical shift register due to the two-dimensional effect.

Figure 8:
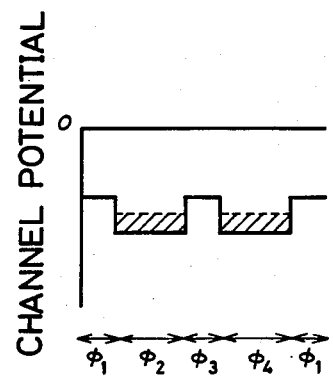
FIG. 8 is a schematic chart showing a charge storage condition when the clock pulses of FIG. 7 are applied to the CCD image sensor of FIG. 1.

FIG. 8 shows the charge storage condition in the vertical shift register. The charges are stored in the wide areas covered by the lower polysilicon electrodes 7 and 9 and, therefore, the signal charges are not restricted by these areas.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A drive method for a charge coupled device (CCD) image sensor which includes a substrate, a plurality of PN junction photodiodes formed in said substrate and aligned in a matrix fashion, a plurality of CCD vertical shift registers formed in said substrate and associated with said plurality of PN junction photodiodes, lower electrode means formed on said CCD vertical shift registers, the lower electrode means being extended to portions provided between adjacent two photodiodes, and upper electrode means formed on said CCD vertical shift registers, the upper electrode means overlapping a portion of said lower electrode means and being extended to said portions provided between adjacent two photodiodes, the drive method comprising the steps of:

applying clock pulses having two levels $V_L$ and $V_I$ to both of said lower and upper electrode means in order to conduct shift operation in said plurality of CCD vertical shift registers while achieving electrical isolation between said plurality of PN junction photodiodes; and applying clock pulses having three levels $V_L$, $V_I$ and $V_H$ to said lower electrode means at a time at which charges stored in said plurality of PN junction photodiodes are transferred to said plurality of CCD vertical shift registers.

2. The drive method of claim 1 wherein said step of applying clock pulses having three levels simultaneously applies said pulses of $V_H$ to adjacent lower electrode means to perform field storage driving of said CCD image sensor.

3. A drive method for a charge coupled device (CCD) image sensor which includes a substrate, a plurality of PN junction photodiode elements formed in said substrate and arranged in a matrix array, a plurality of CCD shift registers for transferring charge from said PN junction photodiode elements, upper and lower electrodes controlling the transfer of charge along said CCD shift registers, an upper and a lower electrode being overlappingly disposed over said CCD shift register adjacent each said PN junction photodiode, said drive method comprising the steps of:

applying alternating clocking waveforms to both of said upper and lower electrodes in order to shift charge along said CCD shift registers while electrically isolating said CCD shift registers from said PN junction photodiodes, said alternating clocking waveforms having first and second voltage levels; and applying a transfer voltage pulse having a voltage higher than said first and second voltage levels to said lower electrodes to transfer charges from said PN junction photodiode to said CCD shift registers.

4. The drive method of claim 3 wherein adjacent said lower electrodes are applied said transfer voltage pulse simultaneously to perform field storage driving of said CCD image sensor.

5. The drive method of claim 3 wherein isolation between said PN junction photodiodes and said CCD shift registers is achieved without the use of channel stoppers therebetween.

* * * * *